(12) United States Patent
Verhoef (10) Patent No.: US 10,581,378 B1
(45) Date of Patent: Mar. 3, 2020

(54) APPARATUS AND METHOD FOR SHORTENING START-UP TIME OF A CRYSTAL OSCILLATOR

(71) Applicant: Dialog Semiconductor B.V., s-Hertogenbosch (NL)

(72) Inventor: Bram Verhoef, s-Hertogenbosch (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 128 days.

(21) Appl. No.: 15/857,877

(22) Filed: Dec. 29, 2017

(51) Int. Cl.
| | |
|---|---|
| *H03B 5/06* | (2006.01) |
| *H03K 17/22* | (2006.01) |
| *H03K 3/014* | (2006.01) |
| *H03K 3/03* | (2006.01) |
| *H03L 3/00* | (2006.01) |

(52) U.S. Cl.
CPC .............. *H03B 5/06* (2013.01); *H03K 3/014* (2013.01); *H03K 3/0307* (2013.01); *H03K 17/22* (2013.01); *H03B 2200/0094* (2013.01); *H03L 3/00* (2013.01)

(58) Field of Classification Search
CPC .............. H03B 5/06; H03B 2200/0094; H03K 3/0307; H03K 3/014; H03K 17/22; H03L 3/00
See application file for complete search history.

(56) References Cited

U.S. PATENT DOCUMENTS

| | | | |
|---|---|---|---|
| 4,704,587 A | 11/1987 | Ouyang et al. | |
| 6,819,195 B1 * | 11/2004 | Blanchard | H03B 5/06 331/158 |
| 8,120,439 B2 | 2/2012 | Shrivastava et al. | |
| 9,246,435 B1 * | 1/2016 | Kavousian | H03B 5/06 |
| 9,515,604 B2 * | 12/2016 | Griffith | H03B 5/06 |
| 2016/0308491 A1 * | 10/2016 | Elgaard | H03B 5/06 |

OTHER PUBLICATIONS

"A 24MHz Crystal Oscillator with Robust Fast Start-Up Using Dithered Injection," by Danielle Griffith et al., ISSCC 2016 / Session 5 / Analog Techniques / 5.9, 2016 IEEE International Solid-State Circuits Conference, Jan. 31-Feb. 4, 2016, 3 pgs.

* cited by examiner

*Primary Examiner* — Jeffrey M Shin
(74) *Attorney, Agent, or Firm* — Saile Ackerman LLC; Stephen B. Ackerman (57) ABSTRACT

A fast start-up oscillator circuit to reduce a start-up time of a crystal oscillator is presented. The circuit contains a crystal resonator to output a first oscillation signal and a tunable RC oscillator to output a second oscillation signal. A driver is coupled between the tunable RC oscillator and the crystal resonator The driver transfers the second oscillation signal output from the tunable RC oscillator to the crystal resonator. The driver drives the crystal resonator, and a feedback circuit connected between the crystal resonator and the tunable RC oscillator to align a phase of the tunable RC oscillator with a phase of the crystal resonator based on the oscillation signal output by the crystal resonator.

12 Claims, 4 Drawing Sheets

APPARATUS AND METHOD FOR SHORTENING START-UP TIME OF A CRYSTAL OSCILLATOR

TECHNICAL FIELD

The present invention relates to an apparatus and a method for reducing a start-up time of an oscillator. One of the objects of fast crystal start-up oscillators is to reduce the overall system power consumption of electronic devices.

BACKGROUND

Crystal resonators are commonly used in a wide range of electronic equipments to provide a stable clock signal. A start-up time is generally defined as the time from initial power-up of an application to the time a stable clock signal is available. The start-up time is a critical design element as system operation typically does not start until a stable clock signal is established. Further, to minimize power consumption, it is common to disable sections of circuits that are not currently in use. Therefore, the speed at which a circuit can be made available has a direct consequence on power consumption. For the above stated reasons, it is desirable to shorten the start-up time of a crystal oscillator.

Figure 1A:
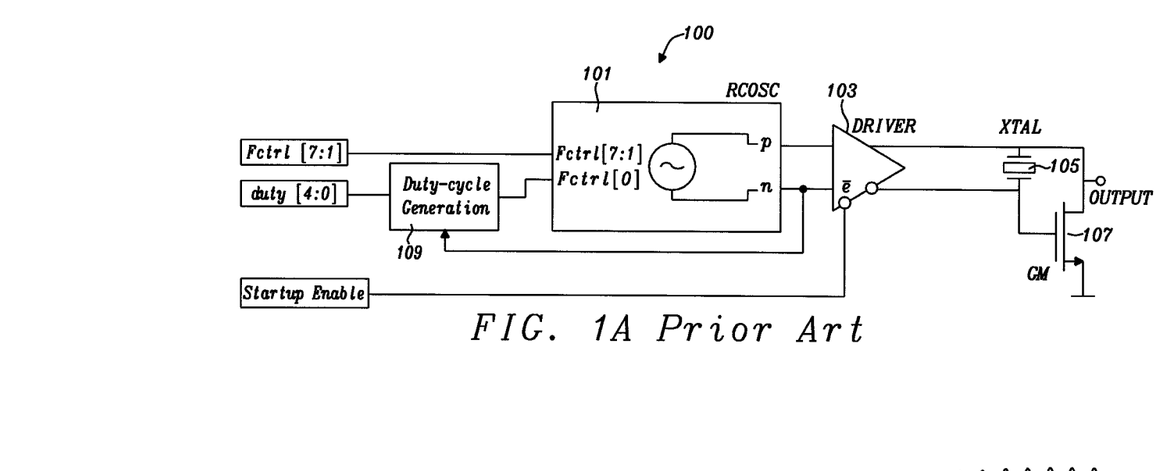
FIG. 1a, which is a prior art circuit, illustrates a block diagram of a start-up crystal oscillator circuit 100.

FIG. 1a illustrates a prior art example consisting of a RC oscillator 101, a driver 103, a crystal resonator 105, a transconductance circuit 107 and a duty-cycle generator 109. The output of the duty-cycle generator 109 is connected to the RC oscillator 101 to provide duty cycles. The output of the RC oscillator 101 is transferred to the crystal resonator 105 via a driver 103. The driver 103 is enabled or disabled using a startup enable signal. The output of crystal resonator 105 is connected to the transconductance circuit 107. More details as to this prior art setup can be found at http://ieeexplore.ieee.org/document/7417928/"5.9 A 24 MHz crystal oscillator with robust fast start-up using dithered injection".

Figure 1B:
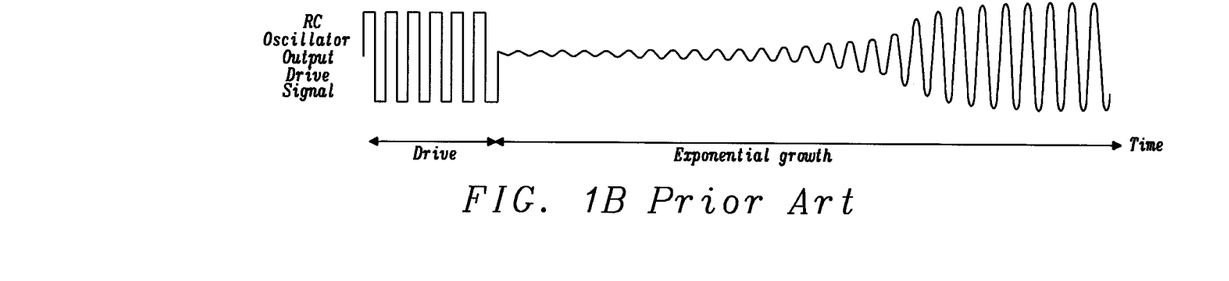

In the prior art, the start-up time of the crystal resonator 105 is shortened by injection from an energy source i.e. the RC oscillator 101. An accurate reference RC oscillator 101 (with a frequency close to the crystal resonator frequency) is used to initially force the crystal resonator 105 and buildup signal amplitude. As shown in FIG. 1b, the RC oscillator 101 output drive signal (shown as a square waveform) is disabled after a fixed period of time (e.g. after 5 μs) to prevent phase-misalignment from occurring. After the output of the RC oscillator 101 is disabled because the driver 103 is disabled by "startup enable" signal, the signal amplitude increases in a traditional way (shown as an exponentially increasing sine waveform in FIG. 1b).

The disadvantage of the above equipment/method is that as the quality factor of the crystal resonator 105 is very high, an accurate oscillation frequency of the reference clock i.e. RC oscillator 101 is required. In practice only a marginal amount of energy may be inserted in the crystal resonator 105, before the phase of the reference clock is no longer synchronous with the crystal resonance of crystal resonator 105. Further, since the RC oscillator 101 is not synchronous with the crystal resonance of crystal resonator 105, the crystal resonator 105 drive may misalign, resulting in the decline of signal amplitude and thus, hindering a fast startup.

SUMMARY

It would be desirable to provide an apparatus and a method for shortening a start-up time of a crystal oscillator.

An aspect of the invention is to shorten the start-up time of a crystal oscillator.

An aspect of an embodiment of the invention is to overcome the misalignment between a RC oscillator and the crystal oscillator.

An aspect of another embodiment of the invention is to reduce the overall system power consumption of electronic devices.

An aspect of the invention is to provide a fast start-up oscillator circuit, wherein the circuit comprising: a first oscillator configured to output a first oscillation signal; a second oscillator con-figured to output a second oscillation signal; a driver coupled between the second oscillator and the first oscillator, wherein the driver transfers the second oscillation signal output by the second oscillator to the first oscillator, to drive the first oscillator; and a feedback circuit connected between the first oscillator and the second oscillator to align a phase of the second oscillator with a phase of the first oscillator based on the first oscillation signal output by the first oscillator. The presence of the feedback circuit in the present invention overcomes the shortcomings of misalignment between the RC oscillator 101 and the crystal resonator 105 discussed above by providing a feedback loop, which allows the phase from the second oscillator to be synchronized with the first oscillator. This synchronization allows energy to be constructively injected from the second oscillator to the first oscillator. As the second oscillator is allowed to continue to inject energy in to the first oscillator for a longer period of time, the result is a reduced crystal oscillator startup time as compared to the above discussed prior art technique.

The feedback circuit is configured to generate a start signal to start the second oscillator, wherein the feedback circuit is configured to generate the start signal at a specific phase of the first oscillator. The second oscillator is arranged to reset the second oscillating signal based on the received start signal.

The fast start-up oscillator circuit may operate in a drive mode and a synchronization mode; wherein during the drive mode, the driver transfers the second oscillation signal output by the second oscillator to the first oscillator, and during the synchronization mode, the driver stops transfer of the oscillation signal of the second oscillator to the first oscillator, and wherein during the synchronization mode, the phase of the first oscillation signal output by the first oscillator is determined. The purpose of the drive mode is to allow the second oscillator signal, which is aligned in phase with the first oscillator signal to be constructively added to first oscillator signal whereas the purpose of the synchronization mode is to allow detection of the phase of the first oscillation signal to be used to align the second oscillator signal.

The feedback circuit may comprise a comparator connected to the output of the first oscillator, the comparator being configured to detect a phase of the first oscillating signal of the first oscillator, and a synchronizing circuit to provide a start signal for the second oscillator based on the detected phase of the first oscillating signal of the first oscillator.

The feedback circuit may further comprise a delay circuit connected to an output terminal of the comparator to introduce a phase shift to the detected phase of the oscillating signal of the first oscillator.

The feedback circuit is configured to generate a start signal to start the second oscillator, wherein the feedback circuit is configured to generate the start signal at a specific phase of the first oscillator, wherein the feedback circuit is configured to generate the start signal at a transition time from the synchronization mode to the drive mode.

The person skilled in the art will understand that the features described above may be combined in any way deemed useful. Moreover, modifications and variations described in respect to the fast start-up oscillator circuit may likewise be applied to the method, and vice versa.

BRIEF DESCRIPTION OF THE DRAWINGS

The present invention will be discussed in more detail below with reference to the accompanying drawings. The drawings are only intended to show embodiments of the present invention and not to limit its scope. The scope of the present invention is defined in the annexed claims and by its technical equivalents.

FIG. 1b illustrates a signal flow diagram of the circuit 100 illustrated in FIG. 1a.

FIG. 3b illustrates a signal flow diagram of the individual components illustrated in FIG. 3a.

DESCRIPTION

In the following description, a number of example embodiments will be described in detail. However, the description of these embodiments is not intended to limit the scope of protection. Also, examples of particular circuits and components of the electronic device will be described in the following. However, it is noted that in view of the present disclosure, the techniques described in respect thereto may be applied in a similar way using alternative or modified techniques. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

Figure 2:
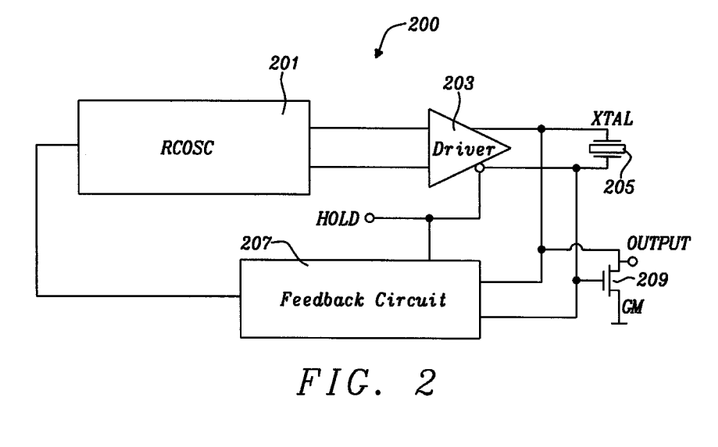
FIG. 2 illustrates a block diagram of a fast start-up crystal oscillator circuit 200 with a feedback circuit 207 according to an embodiment of the present disclosure.

FIG. 2 shows a block diagram of a fast start-up crystal oscillator circuit 200 with a feedback circuit 207 according to an embodiment of the present disclosure. FIG. 2 comprises of the following electronic components: a tunable RC oscillator 201, a driver 203, a crystal resonator 205 and a feedback circuit 207. The fast start-up crystal oscillator circuit 200 may comprise a transconductance circuit 209 connected to the crystal resonator 205.

In FIG. 2, the crystal resonator 205 is configured to output a first oscillation signal, the tunable RC oscillator 201 is configured to output a second oscillation signal, the driver 203 is coupled between the tunable RC oscillator 201 and the crystal resonator 205, wherein the driver 203 transfers the second oscillation signal output by the tunable RC oscillator 201 to the crystal resonator 205, to drive the crystal resonator 205, and a feedback circuit 207 is connected between the crystal resonator 205 output and the input of tunable RC oscillator 201 to align a phase of the output signal of the tunable RC oscillator 201 with a phase of the output signal of the crystal resonator 205 based on the first oscillation signal output by the crystal resonator 205.

The feedback circuit 207 is configured to generate a start signal to start the tunable RC oscillator 201, wherein the feedback circuit 207 is configured to generate the start signal at a specific phase of the crystal resonator 205. Furthermore, based on the received start signal, the tunable RC oscillator 201 is arranged to reset phase of the second oscillating signal.

The fast start-up crystal oscillator circuit with the feedback circuit 207 is configured to operate in a drive mode and a synchronization mode. The synchronization mode may sometimes be referred to as a measurement mode. The working of the fast start-up crystal oscillator circuit starts with the drive mode and is followed by the synchronization mode. Alternatively, the circuit may start with the synchronization mode followed by the drive mode. In this case, when there is no energy present in the crystal resonator 205, in practice, the feedback circuit 207 comprising a comparator will not detect any signal. This means that the feedback loop will wait indefinitely (lock-up). This is overcome using a 'maximum' delay to prevent this 'lock' from ever happening (after the delay, the RC oscillator 201 and the driver 203 are forced ON). During the drive mode, the driver 203 transfers the second oscillation signal output by the second oscillator 201 to the first resonator 205, and during the synchronization mode, the driver 203 stops transfer of the oscillation signal of the second oscillator 201 to the first resonator 205. Furthermore, during the synchronization mode, the phase of the first oscillation signal output by the first resonator 205 is detected. The time period for the drive mode and the synchronization mode can be adjusted according to need. It may be more or less than 5 μs.

The tunable RC oscillator 201 may be a linear or a non-linear type of an electronic oscillator and can be tuned to different frequencies. The tunable RC oscillator 201 can be tuned from 25 MHz to 40 Mhz. The tunable RC oscillator 201 is configured to provide an injection energy in the form of an oscillation signal to the crystal resonator 205. The output of the tunable RC oscillator 201 is transferred to the crystal resonator 205 via a driver 203. The tunable RC oscillator 201 may be referred to as a second oscillator and its output as a second oscillating signal.

The driver 203 is an electronic circuit that regulates the signal flow between the tunable RC oscillator 201 and the crystal resonator 205. The driver 203 is coupled between the tunable RC oscillator 201 and the crystal resonator 205 such that it transfers the oscillation signal output by the tunable RC oscillator 201 to the crystal resonator 205 to drive the crystal resonator 205. In certain embodiments, the driver 203 connects the output of the tunable RC oscillator 201 to the input of the crystal resonator 205 during the drive mode and disconnects the output of the tunable RC oscillator 201 to the input of the crystal resonator 205 during the synchronization mode. The driver 203 is enabled or disabled using a signal indicated with "hold". Typically, the driver 203 is enabled during the drive mode and disabled during the synchronization mode.

The crystal resonator 205 may be a quartz crystal type. It could also be employed with a microelectromechanical systems (MEMS) tuning-fork resonator, for example. As an alternative, the crystal resonator 205 could be replaced by an electronic oscillator, for example, an (R)LC resonator circuit, or any resonator that may be modelled as a RLC series circuit. The crystal resonator 205 may be referred to as a first oscillator and its output as a first oscillating signal.

The transconductance circuit 209 is present to feed energy to the crystal resonator 205. The signal from the transconductance circuit 209 is such that it (exactly) cancels the losses in the crystal resonator 205. This way, a stable oscillating signal is obtained. Usually this may be a single MOS device that is biased with a current-source. Typically an amplitude feedback mechanism is employed that generates the bias current. The amplitude feedback loop then maintains a constant amplitude. In classic start-up methods, the bias-current is typically quite high at start-up, which allows for the signal amplitude to grow (exponentially). At some point the amplitude feedback loop reduces the bias current to a level where the oscillation is stable. Stability is obtained when all the losses in the resonator is 'cancelled' by the transconductance. Another example can be using a simple inverter. In this case, there will be no amplitude control and the amplitude is limited by the supply voltage.

The feedback circuit 207 is connected between the crystal resonator 205 and the tunable RC oscillator 201. The feedback circuit 207 detects a phase of the output signal of the crystal resonator 205 and aligns the phase of the output signal of the tunable RC oscillator 201 based on the detected phase of the output signal of the crystal resonator 205. The feedback circuit 207 is enabled or disabled using a signal indicated with "hold". Typically, the feedback circuit 207 is disabled during the drive mode and enabled during the synchronization mode.

To this point, components comprising the fast start-up crystal oscillator circuit 200 with the feedback circuit 207 have been described. As a next step, an example of the operation of the circuit 200 will be described.

The operation starts with the drive mode i.e. first drive mode. In the drive mode, the tunable RC oscillator 201 generates an oscillation signal. The output signal of the tunable RC oscillator 201 is transferred to the driver circuit 203. In the drive mode, the driver circuit 203 is enabled. This driver circuit 203 is typically as simple as a tri-state driver. This is a type of driver that can output a low voltage (0), a high voltage (1) or can be an 'open circuit' (Z). In the Z state, the output impedance is high-ohmic. Typically the circuit comprises of a (large) NMOST and PMOST. The NMOST is enabled when the output voltage needs to be low, and the PMOST is enabled when the output needs to be high. In the Z stage, both the NMOST and the PMOST are off. Hence, the driver circuit 203 will transfer the oscillation signal output by the tunable RC oscillator 201 to the crystal resonator 205. The oscillation signal received from the tunable RC oscillator 201 may provide the initial energy to drive the crystal resonator 205 into vibration.

In the next step, the mode changes from the drive mode to the synchronization mode i.e. first synchronization mode. In the synchronization mode, the driver 203 is disabled. I.e., in the synchronization mode, the driver 203 is thus in the Z-state and does not load the resonator 205 (high impedance) and, thus, stops the transfer of the oscillation signal of the tunable RC oscillator 201 to the crystal resonator 205. During the synchronization mode, the oscillation of the crystal resonator 205 is fed back to the tunable RC oscillator 201 using the feedback circuit 207. The feedback circuit 207 determines the phase of the oscillation signal received from the crystal resonator 205. Based on the determined phase of the oscillation signal of the crystal resonator 205, the feedback circuit 207 generates a start signal at a specific phase of the crystal resonator 205.

Next, there is a transition from the synchronization mode to a second drive mode, in which the start signal is applied to the input of tunable RC oscillator 201. The feedback circuit 207 may be configured to reset the phase of the tunable RC oscillator 201 to align its output signal with the specific phase of the output signal of crystal resonator 205.

In the second drive mode, the oscillating signal output by the tunable RC oscillator 201 is controlled to have substantially the same phase as the phase of the crystal resonator 205. Here, "substantially" indicates that these two phases are aligned as good as possible. A margin of less than 5% phase difference is achievable with current technology. It is observed that there is a relation between the frequency accuracy of the RC oscillator 201 and the accuracy of the phase-alignment. It is preferred to keep the phase-error well below +/−25%. When the phase is misaligned by more than this, energy is drawn from the resonator 205. The initial phase error (i.e., 5%, by the detector/feedback network) combined with the error due to the frequency error of the RC oscillator 201 is preferably kept below this 25%. It is also observed that (if the initial phase-error is deterministic) one could tune the RC oscillator 201 to a slightly different frequency such that the error in the detection of the phase is (mostly) mitigated.

As two phases are aligned, the injected energy from the tunable RC oscillator 201 is constructively added to the oscillating signal of the crystal resonator 205. After each drive mode and synchronization mode sequence, the amplitude of the oscillating signal of the crystal resonator 205 increases. The cycle of subsequent drive mode and synchronization mode may be repeated several times. The sequence is stopped when the amplitude of the oscillating signal is sufficiently high. In the embodiment of FIG. 3B, this is shown to happen during the $3^{rd}$ Sync period where the sync 401 is set (to level 1) but not cleared (to level 0) as is done during the previous Sync periods.

It is observed that in the shown setup, there is no component actively measuring the resonance signal level. I.e., in the shown implementation of the circuit the phase and frequency errors of the phase-detector and RC oscillator 201 are quite small. This means that all of the drive-cycles constructively add to the resonance and the required number of drive-cycles can be pre-calculated. As soon as the required number of drive-cycles is reached (as may be easily implemented by a counter counting the number of Drive periods or Sync periods) the sync 401 is set, and is never cleared. This permanently disables the driver 203 and the RC oscillator 201, while the CMP block 309 is enabled (cf. FIG. 3B in the $3^{rd}$ Sync cycle where the 'sync' signal is not cleared). The final amplitude of the resonance is therefore quite deterministic. In practice, there may be some other effects that come into play, such as temperature dependence of the amplitude feedback loop. As this is also quite deterministic, the circuit can be designed to also compensate for this (by measuring the temperature).

After the sequence is stopped, the transconductance circuit 209 which is connected to the crystal resonator 205 maintains the amplitude. In an implementation, the transconductance circuit 209 may be disabled to reduce power consumption. This completes the operation of the circuit 200.

Figure 3A:
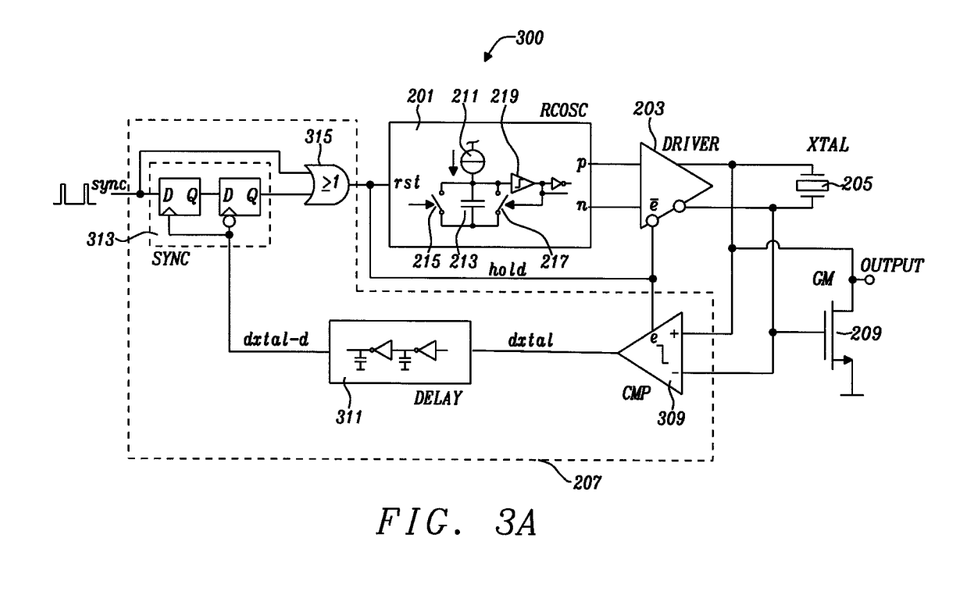
FIG. 3a illustrates a detailed block diagram with individual components of a fast start-up crystal oscillator circuit 300 with a feedback circuit 207 according to an embodiment of the present disclosure.
Figure 3B:
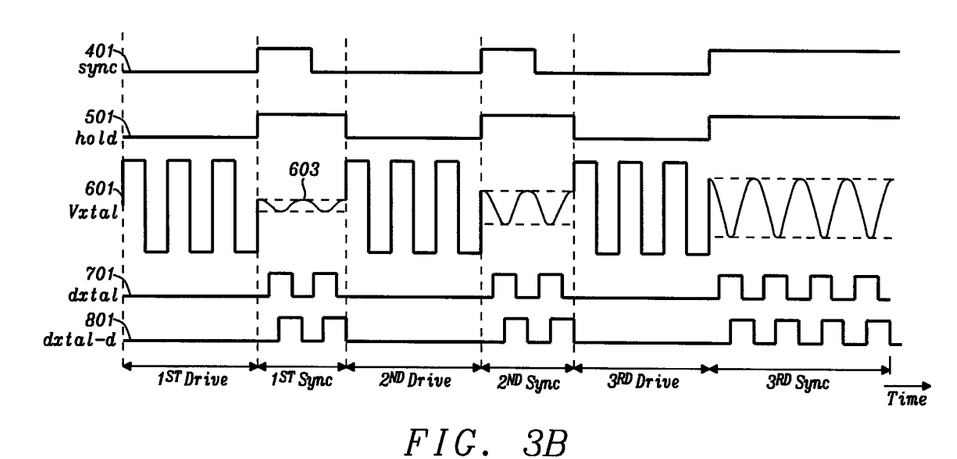

FIG. 3a illustrates a detailed block diagram showing, by means of example, individual components of a fast start-up crystal oscillator circuit 300 with a feedback circuit 207. FIG. 3a comprises of the following electronic components: the tunable RC oscillator 201, the driver 203, the crystal resonator 205 and the feedback circuit 207. The fast start-up crystal oscillator circuit 300 may comprise the transconductance circuit 209 connected to the crystal resonator 205.

The fast start-up crystal oscillator circuit 300 with the feedback circuit 207 is configured to operate in a drive mode and a synchronization mode. The synchronization mode may sometimes be referred to as a measurement mode. The working of the fast start-up crystal oscillator circuit 300 may start with the drive mode and is followed by the synchronization mode. Alternatively, the circuit may start with the synchronization mode followed by the drive mode. The time period for the drive mode and the synchronization mode can be adjusted according to need. In certain embodiments, the duration of the drive mode may be about 1 us, however, may be in a range of 0.2-5 us, and the duration of the synchronization mode may be about 500 ns, however, typically in a range of 200-5000 ns.

The tunable RC oscillator 201 in the FIG. 3a is, functionally, a same component as the tunable RC oscillator 201 used in the FIG. 2. The tunable RC oscillator 201 may be referred to as a second oscillator and its output as a second oscillating signal 601 (as shown in FIG. 3b). In the shown implementation, the RC oscillator 201 comprises a current source 211 and a capacitor 213 connected in series. Two parallel connected switches 215, 217 are connected in parallel to the capacitor 213. Switch 215 is operated by rst signal. A comparator 219 is connected such as to detect when a certain threshold voltage across capacitor 213 is reached. The output of comparator 219 is connected such as to switch the switch 217.

The driver 203 in the FIG. 3a is a same component as the driver 203 used in the FIG. 2.

The crystal resonator 205 in the FIG. 3a is a same component as the crystal resonator 205 used in the FIG. 2. The crystal resonator 205 may be referred to as a first oscillator and its output as a first oscillating signal 603 (as shown in FIG. 3b).

The transconductance circuit 209 in the FIG. 3a is a same component as the transconductance circuit 209 used in the FIG. 2.

The feedback circuit 207 is connected between the crystal resonator 205 and the tunable RC oscillator 201. The feedback circuit 207 detects the phase of the output signal of the crystal resonator 205 and aligns the phase of the output signal of the tunable RC oscillator 201 based on the detected phase of the output signal of the crystal resonator 205. The feedback circuit 207 may comprise following components: a comparator 309, a delay circuit 311 and a synchronizing circuit 313.

The comparator 309 is connected to the output of the crystal resonator 205. The comparator 309 is configured to detect a phase of the oscillating signal of the crystal resonator 205. The input to the comparator 309 may be an analog signal from the crystal resonator 205, which is measured and digitized. The digitized output signal of the comparator 309 is referred as "dxtal" in the FIG. 3a.

The delay circuit 311 may be connected to an output terminal of the comparator 309. The delay circuit 311 introduces a phase shift to the detected phase of the oscillating signal of the crystal resonator 205. A phase shift of 90° is typically introduced. However, the degree of phase shift can be adjusted to any desired value and not limiting to 90°. This may take into account, or compensate for, the delay of the components of the circuit. The phase shifted output signal of the delay circuit 311 is referred as "dxtal-d" in the FIG. 3a.

An input of synchronizing circuit 313 is connected to the output of the delay circuit 311. Another input of synchronizing circuit 313 receives a sync signal. The output of synchronizing circuit 313 is connected to one of the inputs of an OR gate 315. The OR gate 315 has at least a second input receiving the sync signal. The output of the OR gate 315 is connected to the input rst of the tunable RC oscillator 201. Moreover, the output of OR gate 315 is connected to an enable/disable input of driver 203 and an enable/disable input of comparator 309. The signal to these enable/disable inputs is indicated with "hold".

The synchronizing circuit 313 receives the phase shifted output signal from the delay circuit 311. The synchronization circuit 313 uses the phase shifted output signal to provide a start signal for the tunable RC oscillator 201. The start signal is configured to trigger the tunable RC oscillator 201 and reset the phase of the output signal of the tunable RC oscillator 201 to align with the phase of the output signal of the crystal resonator 205. When the sync signal is set (e.g., having a logic value of "1"), it will trigger the tunable RC oscillator 201 the first time that "dxtal-d" is set (e.g., having a logic value of "1").

To this point, individual components comprising the fast start-up crystal oscillator circuit 300 with the feedback circuit 207 have been described. As a following step, the operation of the circuit 300 will be described in detail with reference to FIG. 3b.

FIG. 3b illustrates a signal flow diagram of the individual components illustrated in FIG. 3a. The example of FIG. 3b is based on the d flip-flops in the SYNC block having an asynchronous reset. In the example of FIG. 3b, initially, the circuit 300 is in the drive mode i.e. first drive mode. I.e., in this drive mode, due to the d flip-flops in the SYNC block having an asynchronous reset, the sync signal has a logic 0 value and the output of the synchronization circuit 313 has a logic 0 value. Thus, the output of OR gate 315 is also having a logic 0 value. Consequently, also hold=0, which logic 0 value is converted to become a logic 1 value in order to enable driver 203 and disable comparator 309. Note that the comparator 309 need not be disabled. However, doing so, may save some power.

During the first drive mode, the tunable RC oscillator 201 receives this logic 0 value input signal and will generate an oscillation signal 601 (as shown in FIG. 3b). I.e., the RC oscillator 201 will start to oscillate whenever the rst signal is '0'. The RC oscillator 201 is configured such that it will 'nicely' start with a full cycle when rst falls from 1 to 0. The output signal of the tunable RC oscillator 201 is transferred to the driver 203. Because the driver circuit 203 is enabled the oscillation signal 601 is transferred to the crystal resonator 205. Also, during the first drive mode, the feedback circuit 207, comprising of the comparator 309, the delay circuit 311 and the synchronization circuit 313 are not enabled because hold=0. The oscillation signal 601 received from the tunable RC oscillator 201 provides the initial energy to drive the crystal resonator 205 into oscillation.

When sync becomes logic value 1, the output of OR gate 315 switches to a logic 1 value too. Thus, rst=1 and hold=1 too. Then, the mode switches from the first drive mode to the first synchronization mode, the driver 203 stops the transfer of the oscillation signal 601 of the tunable RC oscillator 201 to the crystal resonator 205 because it will be disabled by the hold signal. At the same time, the comparator 309 is enabled by hold=1. During the first synchronization mode, the oscillation signal 603 (as shown in FIG. 3b) of the crystal resonator 205 is fed back to the comparator 309 using the feedback loop 207. The comparator 309 detects the phase of the oscillating signal 603 of the crystal resonator 205 and digitizes the oscillating signal 603. This phase detected signal is shown as a square waveform 701 (as shown in FIG. 3b) under the first synchronization mode in FIG. 3b. In the next step, the output of comparator 309 i.e. the phase detected signal 701 is passed on to the delay circuit 311. The delay circuit 311 may introduce a phase shift of 90° to the phase detected signal 701, which is shown as a square waveform 801 under the first synchronization mode in FIG. 3b. Thereafter, the phase shifted signal 801 is passed to the synchronizing circuit 313. The synchronization circuit 313 uses the phase shifted signal 801 to provide a start signal for the tunable RC oscillator 201.

The start signal is configured to reset the phase of the output signal of tunable RC oscillator 201 to align with the phase of the oscillating signal 603 of the crystal resonator 205 in the following way. When the RC oscillator 201 is enabled the capacitor 213 is charged with the current from the current source 211. The voltage on the capacitor 213 increases linearly with time. Comparator 219 detects when a certain threshold is reached. The output of this comparator 219 switches the switch 217 such that the capacitor 213 is discharged (very quickly) and then a new cycle is started. When the rst signal is '1' switch 215 is switched to keep the voltage on capacitor 213 low. When the rst signal drops to '0', the RC oscillator 201 starts with a full cycle.

In practice different implementations are possible, of course. E.g., two alternating capacitors may be used. There may, then, be some logic to select which capacitor is actively used and which is discharged. The operation principle is the same, but the advantage is that the capacitor doesn't need to be discharged as quickly.

Next, there will be a moment in time that both sync=0 and the output signal of synchronizing circuit 313 will have a logic 0 value (cf. FIG. 3b). Then, both rst=0 and hold=0 and the first synchronization mode ends. This moment in time marks a transition to a second synchronization mode.

At the transition from the first synchronization mode to the second drive mode, the tunable RC oscillator 201 receives rst=0 and, consequently, is started again. When the tunable RC oscillator 201 re-starts, the phase of the output of the tunable RC oscillator 201 is aligned with the phase of the oscillating signal 603 of the crystal resonator 205. As a result, the crystal resonator 205 receives energy substantially in phase with its oscillating signal 603 and the amplitude of the oscillating signal 603 of the crystal resonator 205 is increased. This is shown as oscillating signal 603 under the $2^{nd}$ synchronization mode in FIG. 3b.

After each drive mode and synchronization mode sequence, the amplitude of the crystal oscillator signal 603 increases. The modes are stopped when the amplitude of the crystal oscillator signal 603 is sufficiently high and the transconductance circuit 209 connected to the crystal resonator 205 maintains the amplitude. As this process allows re-alignment of the phase of the tunable RC oscillator 201 with the phase of the crystal resonator 205, an arbitrary amount of energy can be added into the crystal 205. As a result, this process overcomes the shortcomings of misalignment between the RC oscillator and the crystal oscillator via a feedback function and is, also, independent of the crystal's parasitic i.e. shunt capacitance.

What is claimed is:

1. A start-up oscillator circuit, the circuit comprising:
   a first oscillator configured to output a first oscillation signal;
   a second oscillator configured to output a second oscillation signal;
   a driver coupled between the second oscillator and the first oscillator, wherein the driver transfers the second oscillation signal output by the second oscillator to the first oscillator, to drive the first oscillator; and
   a feedback circuit connected between the first oscillator and the second oscillator to align a phase of the second oscillation signal of the second oscillator with a phase of the first oscillation signal of the first oscillator based on the first oscillation signal output by the first oscillator, wherein the feedback circuit is configured to generate a start signal to start the second oscillator, and wherein the feedback circuit is configured to generate the start signal at a specific phase of the first oscillation signal of the first oscillator.

2. The circuit of claim 1, wherein second oscillator is arranged to reset the second oscillating signal based on the received start signal.

3. The circuit of claim 1, wherein the circuit is operable in a drive mode and a synchronization mode;
   wherein during the drive mode, the driver transfers the second oscillation signal output by the second oscillator to the first oscillator, and during the synchronization mode, the driver stops transfer of the second oscillation signal of the second oscillator to the first oscillator, and
   wherein during the synchronization mode, the phase of the first oscillation signal output by the first oscillator is determined.

4. The circuit of claim 3, the feedback circuit further comprising:
   a delay circuit connected to an output terminal of the comparator to introduce a phase shift to the detected phase of the oscillating signal of the first oscillator.

5. A start-up oscillator circuit, the circuit comprising:
   a first oscillator configured to output a first oscillation signal;
   a second oscillator configured to output a second oscillation signal;
   a driver coupled between the second oscillator and the first oscillator, wherein the driver transfers the second oscillation signal output by the second oscillator to the first oscillator, to drive the first oscillator; and
   a feedback circuit connected between the first oscillator and the second oscillator to align a phase of the second oscillation signal of the second oscillator with a phase of the first oscillation signal of the first oscillator based on the first oscillation signal output by the first oscillator, the feedback circuit comprising:
   a comparator connected to the output of the first oscillator, the comparator being configured to detect a phase of the first oscillating signal of the first oscillator; and
   a synchronizing circuit to provide a signal used to generate a start signal for the second oscillator based on the detected phase of the first oscillating signal of the first oscillator.

6. A start-up oscillator circuit, the circuit comprising:
   a first oscillator configured to output a first oscillation signal;
   a second oscillator configured to output a second oscillation signal;
   a driver coupled between the second oscillator and the first oscillator, wherein the driver transfers the second oscillation signal output by the second oscillator to the first oscillator, to drive the first oscillator; and
   a feedback circuit connected between the first oscillator and the second oscillator to align a phase of the second oscillation signal of the second oscillator with a phase of the first oscillation signal of the first oscillator based on the first oscillation signal output by the first oscillator,
   wherein the circuit is operable in a drive mode and a synchronization mode;
   wherein during the drive mode, the driver transfers the second oscillation signal output by the second oscillator to the first oscillator, and during the synchronization mode, the driver stops transfer of the second oscillation signal of the second oscillator to the first oscillator, and wherein during the synchronization mode, the phase of the first oscillation signal output by the first oscillator is determined, wherein the feedback circuit is further configured to generate a start signal to start the second oscillator, wherein the feedback circuit is configured to generate the start signal at a specific phase of the first oscillator, and wherein the feedback circuit is configured to generate the start signal at a transition time from the synchronization mode to the drive mode.

7. A method for starting up an oscillator circuit, the method comprising the steps of:

generating a second oscillation signal using a second oscillator;

transferring the second oscillation signal output by the second oscillator to a first oscillator, to drive the first oscillator; and aligning a phase of the second oscillation signal of the second oscillator with a phase of a first oscillation signal of the first oscillator based on the first oscillation signal output by the first oscillator by a feedback circuit connected between the first oscillator and the second oscillator, generating a start signal to start the second oscillator, wherein the start signal is generated at a specific phase of the first oscillation signal of the first oscillator.

8. The method of claim 7, wherein the start signal is used to reset the second oscillating signal of the second oscillator.

9. The method of claim 7, wherein the transferring of the oscillation signal to the first oscillator by a driver further comprises:

transferring the oscillation signal of the second oscillator to the first oscillator during the drive phase, and stopping transfer of the second oscillation signal of the second oscillator to the first oscillator during the synchronization phase.

10. The method of claim 6, wherein the start signal is applied to the second oscillator at a time of transition from the synchronization mode to the drive mode.

11. A method for starting up an oscillator circuit, the method comprising the steps of:

generating a second oscillation signal using a second oscillator;

transferring the second oscillation signal output by the second oscillator to a first oscillator, to drive the first oscillator; and aligning a phase of the second oscillation signal of the second oscillator with a phase of a first oscillation signal of the first oscillator based on the first oscillation signal output by the first oscillator by a feedback circuit connected between the first oscillator and the second oscillator, wherein the transferring of an oscillation signal from the first oscillator to the second oscillator as a feedback further comprises:

transferring the first oscillation signal output by the first oscillator to a comparator for detecting a phase of the first oscillation signal; and providing the detected phase as a signal used to generate a start signal to the second oscillator using a feedback circuit.

12. The method of claim 11, wherein the providing the detected phase as a signal further comprises:

transferring the detected phase to a delay circuit for introducing a phase shift to the detected phase; and providing the signal used to generate the start signal to the second oscillator based on the phase shifted signal.

* * * * *